(12) United States Patent
Xin et al.

(10) Patent No.: US 11,387,281 B2
(45) Date of Patent: Jul. 12, 2022

(54) ARRAY SUBSTRATE, DISPLAY PANEL AND DISPLAY DEVICE, ENABLING FULL SCREEN DISPLAY WITH TRANSPARENT AND NON-TRANSPARENT DISPLAY AREAS

(71) Applicant: Yungu (Gu'an) Technology Co., Ltd., Hebei (CN)

(72) Inventors: Zhenghang Xin, Kunshan (CN); Junhui Lou, Kunshan (CN); Meng Zhang, Kunshan (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 137 days.

(21) Appl. No.: 17/007,474

(22) Filed: Aug. 31, 2020

(65) Prior Publication Data

US 2020/0403043 A1 Dec. 24, 2020

Related U.S. Application Data

(63) Continuation of application No. PCT/CN2019/092946, filed on Jun. 26, 2019.

(30) Foreign Application Priority Data

Dec. 28, 2018 (CN) .......................... 201811653051.9

(51) Int. Cl.
  *H01L 27/32* (2006.01)
  *H01L 51/52* (2006.01)
(52) U.S. Cl.
  CPC ...... *H01L 27/3211* (2013.01); *H01L 27/3246* (2013.01); *H01L 27/3283* (2013.01); *H01L 51/5209* (2013.01)
(58) Field of Classification Search
  CPC ............. H01L 27/3211; H01L 27/3246; H01L 27/3283; H01L 51/5209

(Continued)

(56) References Cited

U.S. PATENT DOCUMENTS

2007/0252518 A1   11/2007   Lee et al.
2016/0042702 A1*   2/2016   Hirakata ............... G02F 1/1368
                                                                          345/87
2018/0277592 A1*   9/2018   Moon ................... H01L 27/156

FOREIGN PATENT DOCUMENTS

CN         101064335 A      10/2007
CN         101819983 A       9/2010
(Continued)

OTHER PUBLICATIONS

TW Patent Office, Office Action Issued in Application No. 108123663, dated Jan. 7, 2020, 7 pages (Submitted with Partial Translation).

(Continued)

*Primary Examiner* — Xia L Cross
(74) *Attorney, Agent, or Firm* — Maier & Maier, PLLC

(57) ABSTRACT

An array substrate, a display panel, and a display device. The array substrate includes a substrate; a first electrode layer formed on the substrate; a light emitting layer formed on the first electrode layer and including a first light emitting area and a second light emitting area, the first light emitting area including a plurality of first light emitting blocks, the second light emitting area including a plurality of second light emitting blocks, and the first light emitting blocks and the second light emitting blocks formed by the same process; and a second electrode layer formed on the light emitting layer; where the first electrode layer includes a plurality of first electrodes corresponding to the first light emitting area, each of the first electrodes corresponds to a plurality of the first light emitting blocks, the first light emitting blocks on the same first electrode have the same color, and the first light emitting area is a transparent area, and the second light emitting area is a non-transparent area.

20 Claims, 16 Drawing Sheets

(58) Field of Classification Search
USPC .......................................................... 257/80
See application file for complete search history.

(56) References Cited

FOREIGN PATENT DOCUMENTS

| | | | |
|---|---|---|---|
| CN | 103872071 | A | 6/2014 |
| CN | 103996691 | A | 8/2014 |
| CN | 204651324 | U | 9/2015 |
| CN | 105572932 | A | 5/2016 |
| CN | 106024836 | A | 10/2016 |
| CN | 207338380 | U | 5/2018 |
| CN | 108336117 | A | 7/2018 |
| CN | 108365122 | A | 8/2018 |
| CN | 108470748 | A | 8/2018 |
| CN | 108598115 | A | 9/2018 |
| CN | 108630730 | A | 10/2018 |
| CN | 108666348 | A | 10/2018 |
| CN | 108766990 | A | 11/2018 |
| CN | 108922900 | A | 11/2018 |
| CN | 108962964 | A | 12/2018 |
| CN | 209071333 | U | 7/2019 |
| TW | 201327801 | A | 7/2013 |
| TW | 201436195 | A | 9/2014 |
| TW | 201440202 | A | 10/2014 |
| TW | 201521226 | A | 6/2015 |
| TW | 201610961 | A | 3/2016 |
| TW | 201702211 | A | 1/2017 |
| TW | 201733108 | A | 9/2017 |
| TW | 201802785 | A | 1/2018 |
| TW | 201817057 | A | 5/2018 |

OTHER PUBLICATIONS

ISA State Intellectual Property Office of the People's Republic of China, International Search Report and Written Opinion issued in Application No. PCT/CN2019/092946, dated Sep. 26, 2019, WIPO, 12 pages.
State Intellectual Property Office of the People's Republic of China, Office Action and Search Report Issued in Application No. 201811653051.9, dated May 8, 2020, 9 pages, (Submitted with Machine Translation).

\* cited by examiner

ARRAY SUBSTRATE, DISPLAY PANEL AND DISPLAY DEVICE, ENABLING FULL SCREEN DISPLAY WITH TRANSPARENT AND NON-TRANSPARENT DISPLAY AREAS

CROSS-REFERENCE TO RELATED APPLICATION

This application is a continuation application of International Application No. PCT/CN2019/092946 filed on Jun. 26, 2019, which claims priority to Chinese patent application No. 201811653051.9 filed on Dec. 28, 2018. Both applications are incorporated herein by reference in their entireties.

TECHNICAL FIELD

The present disclosure relates to the field of display technologies, and in particular, to an array substrate, a display panel, and a display device.

BACKGROUND

With rapid development of electronic devices, users have increasingly higher requirements on screen-to-body ratio, which makes full screen displays of electronic devices receive ever more attention. However, due to the need to integrate components such as a front camera, an earpiece, and an infrared sensor element, an electronic device may not implement display in overall areas of the entire screen, and may not achieve a full screen in a true sense.

SUMMARY

In view of this, the present disclosure provides an array substrate, a display panel, and a display device.

According to an example of the present disclosure, an array substrate is provided, which includes:
a substrate;
a first electrode layer formed on the substrate;
a light emitting layer formed on the first electrode layer and including a first light emitting area and a second light emitting area, the first light emitting area including a plurality of first light emitting blocks, the second light emitting area including a plurality of second light emitting blocks, the first light emitting blocks and the second light emitting blocks formed by the same process; and a second electrode layer formed on the light emitting layer, where the first electrode layer includes a plurality of first electrodes corresponding to the first light emitting area, each of the first electrodes corresponds to a plurality of the first light emitting blocks, and the first light emitting blocks on the same first electrode have the same color, the first light emitting area is a transparent area, and the second light emitting area is a non-transparent area. The same color of the first light emitting blocks corresponding to the same first electrode can reduce the difficulty of evaporation and reduce the risk of color mixing. The first light emitting area is a transparent area that can allow light to pass through, so that the electronic device including the array substrate can equip the photosensitive device below the first light emitting area. Thereby, it can collect or emit light while avoiding occupying the display area of the electronic device, which is beneficial to increase the screen-to-body ratio.

Optionally, at least part of the first light emitting area is surrounded by the second light emitting area.

Optionally, the first electrodes are strip electrodes, and the first electrodes are arranged in one row and multiple columns, one column and multiple rows, two columns and multiple rows, two rows and multiple columns or multiple rows and multiple columns. The first electrodes on the first electrode layer are arranged regularly, which can reduce the processing difficulty, and the second electrode layer adopts a planar electrode structure, which can further simplify the process steps and reduce production costs.

Optionally, a column direction of the first electrodes is parallel or perpendicular to a column direction of the first light emitting blocks.

Optionally, the first electrode layer further includes a plurality of second electrodes corresponding to the second light emitting area, and each of the second electrodes corresponds to a plurality of the second light emitting electrodes thereon. A column direction of the first electrodes is the same as a column direction of the second electrodes, and in the column direction, a width of each of the first electrodes is larger than or equal to a width of each of the second electrodes. It is beneficial to increase the width of the first light emitting block in the column direction, increase the area of the first light emitting block, and beneficial to increase the aperture ratio of the first light emitting block, thereby increasing the light emitting intensity to compensate for the disadvantage that the first light emitting area is a transparent area and the two-way light transmission causes a decrease in brightness.

Optionally, each of the first electrodes corresponds to a plurality of columns of the first light emitting blocks along a first direction, and two adjacent ones of the first light emitting blocks corresponding to the same first electrode along a second direction are aligned or misaligned, and the second direction is perpendicular to the first direction. Based on this, it is possible to reduce the number of first electrodes and reduce the processing difficulty while reducing the mask deformation while the pixel density of the first light emitting area can remain unchanged. The aligned arrangement can reduce the processing requirements on the mask; the misaligned arrangement can improve the evenness of the arrangement of the first light emitting blocks and improve the display effect.

Optionally, a distance between central axes of two adjacent ones of the first light emitting blocks corresponding to the same first electrode in the second direction is 0.5-2 times a size of each of the first light emitting blocks in the second direction.

Optionally, each of the first electrodes includes:
a plurality of first sub-electrodes, adjacent ones of the first sub-electrodes in a second direction are arranged in a misaligned manner, each of the first sub-electrodes corresponds to a column of the first light emitting blocks arranged along a first direction, each of the first sub-electrodes includes a plurality of strip electrodes or block electrodes, and the second direction is perpendicular to the first direction; and a connecting portion electrically connecting two adjacent ones of the strip electrodes or block electrodes.

Optionally, the first light emitting blocks corresponding to two adjacent ones of the first electrodes are aligned or misaligned. The aligned arrangement can reduce the processing requirements for the mask; the misaligned arrangement can improve the evenness of the arrangement of the first light emitting blocks and improve the display effect.

Optionally, the first electrode layer is an anode, the second electrode layer is a cathode, and the second electrode layer is a planar electrode. It can effectively simplify the processing difficulty.

Optionally, the second electrode layer includes a fifth electrode provided corresponding to the first light emitting area, and the fifth electrode is a planar electrode.

Optionally, both edges of each of the first electrodes in the column direction are wave-shaped, peaks of the two wave-shaped edges are arranged opposite to each other, and troughs of the two wave-shaped edges are arranged opposite to each other; and/or both edges of each of the first light emitting blocks in the column direction of the first electrodes are wave-shaped, peaks of the two wave-shaped edges are arranged opposite to each other, and troughs of the two wave-shaped edges are arranged opposite to each other. Therefore, between positions with different widths of the first electrodes and different distances of two adjacent columns of first electrodes, the positions of generating diffraction fringes are different, and the diffraction effects at different positions can cancel each other, which can effectively reduce the diffraction effect.

Optionally, a shape of a projection of each of the first electrodes on the base substrate includes at least one first graphic unit; a shape of a projection of each of the first light emitting blocks on the base substrate includes at least one second graphic unit; and the first graphics unit and/or the second graphics unit include a circle, an ellipse, a dumbbell shape, an "8" shape, or a rectangle.

Optional, the array substrate also includes:

a pixel defining layer, formed on the first electrode layer and including a plurality of first pixel defining holes provided corresponding to the first light emitting area, and each of the first pixel defining holes corresponds to at least one of the first light emitting blocks. The first pixel defining hole is defined by the pixel defining layer to isolate first light emitting blocks corresponding to two adjacent first pixel defining holes, and to reduce the risk of color mixing.

Optionally, the pixel defining layer further includes a plurality of second pixel defining holes corresponding to the second light emitting area, and a size of each of the second pixel defining holes is equal to or smaller than a size of each of the first pixel defining holes. The size of the first pixel defining hole and the second pixel defining hole are equal, which can reduce the difficulty of processing the mask. The size of the first pixel defining hole can be larger than the size of the second pixel defining hole. Thereby when the distance between adjacent first pixel defining holes is equal to the distance between adjacent second pixel defining holes, thus reducing the distribution density of the first pixel defining holes, reduce the number of the gaps between the first pixel defining holes, and reducing the probability of light diffraction.

Optionally, the first light emitting blocks and the second light emitting blocks are all arranged in a plurality of columns and in one-to-one correspondence; and a color of the first light emitting blocks in the same column is the same as a color of a first one of the second light emitting blocks in the column and close to the first light emitting area. Thus reducing the process requirements for the first light emitting area, and reducing the risk of color mixing of the first light emitting area in the same column direction.

Optionally, the first light emitting blocks and the second light emitting blocks are all arranged in a plurality of columns, and at least one of the first light emitting blocks in the same column and at least one of the second light emitting blocks in the same column and close to the first light emitting area constitute a pixel repeat unit. Based on this, a display transition can be made at the junction of the first light emitting area and the second light emitting area to improve the display effect.

Optionally, the first electrode layer and/or the second electrode layer are made of a transparent material; and a light transmittance of the transparent material is larger than or equal to 90%.

According to a second aspect of the examples of the present disclosure, a display panel is provided, including:

the array substrate described in any of the above examples;

an encapsulation layer encapsulating on one side of the array substrate away from the base substrate; the encapsulation layer includes a polarizer covering the second light emitting area, without covering the first light emitting area; and a chip assembly configured to control display states of the first light emitting blocks and the second light emitting blocks.

According to a third aspect of the examples of the present disclosure, a display device is provided, including:

a device body including a device area; and the display panel described in any of the above examples, the display panel covers the device body;

where the device area is located below the first light emitting area, and the device area includes a photosensitive device that emits or collects light through the first light emitting area. The light sensing device is disposed beneath the first light emitting area so as to make sure that the light sensing device operates normally and does not occupy display area, thereby increasing screen-to-body ratio.

It can be known from the above examples that a plurality of first light emitting blocks and second light emitting blocks in the present disclosure are vapor-deposited with one mask, thereby reducing the number of masks and reducing production costs. Since a plurality of first light emitting blocks can be formed on the same first electrode, a plurality of holes can be formed on the mask in the area corresponding to the same electrode on the first light emitting area. Compared with opening a large hole in the mask, the strength of the mask can be improved, the stress can be buffered, the deformation of the mask can be reduced, and the risk of color mixing between adjacent first light emitting blocks can be effectively reduced.

DETAILED DESCRIPTION OF THE EMBODIMENTS

Figure 1:
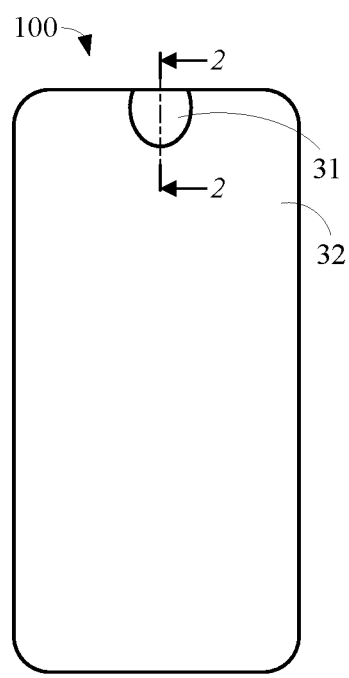
FIG. 1 is a schematic structural diagram illustrating an array substrate according to an example of the present disclosure.

Examples will be described in detail here, examples of which are shown in the drawings. The embodiments described in the following examples do not represent all embodiments consistent with the present disclosure.

It is to be understood that, although terms "first," "second," "third," and the like can be used in the present disclosure to describe various information, such information should not be limited to these terms. These terms are only used to distinguish one category of information from another. For example, without departing from the scope of the present disclosure, first information can be referred as second information; and similarly, second information can also be referred as first information.

In an electronic device such as a mobile phone, a tablet computer, etc., due to the need to integrate components such as a front camera, an earpiece, and an infrared sensor element, a notch may be provided on the display panel, to mount the camera, the earpiece and the infrared sensor element in the notch area, however, the notch area cannot be used to display pictures, such as in the case of using a screen with a notch; or a hole may be provided in the screen. For an electronic device that implements a camera function, external lights can enter a photosensitive device disposed below the screen through the hole in the screen. However, such an electronic device cannot perform display in various areas of the entire screen. For example, the screen cannot perform display in the camera area, so the screen is not a true full screen display either.

Based on the current development trend of electronic devices, how to increase the screen-to-body ratio of the display panel of the electronic device to nearly 100% while ensuring the front-end photographing function of the electronic device has become a problem to be solved in the field.

Figure 2:
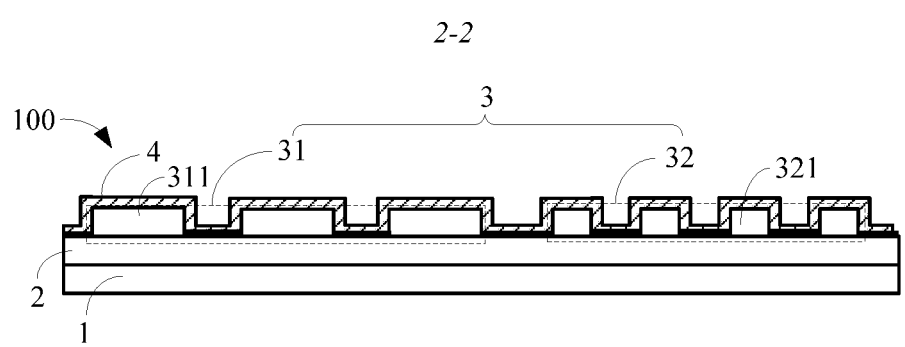
FIG. 2 is a cross-sectional view taken along line 2-2 of FIG. 1.

FIG. 1 is a schematic structural diagram illustrating an array substrate 100 according to an example of the present disclosure, and FIG. 2 is a cross sectional view of FIG. 1 along 2-2.

In an example, a light emitting layer 3 may include a first light emitting area 31 and a second light emitting area 32. As shown in FIG. 1, at least part of the first light emitting area 31 may be surrounded by the second light emitting area 32. For example, the first light emitting area 31 may be completely surrounded by the second light emitting area 32, or one side edge of the first light emitting area 31 may be in contact with the opposite side edge of the second light emitting area 32. In an example, as shown in FIG. 1, the first light emitting area 31 may be fan-shaped; alternatively, the first light emitting area 31 may be circular, rectangular, elliptical, or irregularly shaped.

In an example, as shown in FIG. 2, the array substrate 100 may include a base substrate 1, a first electrode layer 2, a light emitting layer 3, and a second electrode layer 4. The base substrate 1 may include a layer structure such as a substrate, an inorganic layer and an organic layer. The substrate may include a flexible substrate or a rigid substrate. The flexible substrate may be made of a flexible material, and the flexible material may be polyimide (PI), polycarbonate (PC, also known as PC plastic), Polyterephthalate (PET), and the like. The rigid substrate may be made of organic glass. The first electrode layer 2 is formed on the base substrate 1, the light emitting layer 3 is formed on the first electrode layer 2, and the second electrode layer 4 is formed on the light emitting layer 3. The first light emitting area 31 is a transparent area, and the second light emitting area 32 is a non-transparent area. The photosensitive device included in the electronic device equipped with the array substrate 100 may be provided corresponding to the first light emitting area 31. The external light can pass through the first light emitting area 31 and can be collected by the photosensitive device, and the internal light can be emitted outward through the first light emitting area 31. Based on this, the screen corresponding to the photosensitive device can perform display properly while ensuring the normal operation of the photosensitive device, so as not to affect the screen-to-body ratio of the electronic device. When the photosensitive device is turned off, the area of the first light emitting area 31 corresponding to the photosensitive device can be used to display an image, and the image shown by the first light emitting area 31 and the image shown by the second light emitting area 32 can join together to ensure the integrity of the image display and enhance the display effect. In an example, the first light emitting area 31 corresponding to the photosensitive device may also be a static display.

In an example, the first light emitting area 31 may include a plurality of first light emitting blocks 311, and the second light emitting area 32 may include a plurality of second light emitting blocks 321. The first light emitting block 311 and the second light emitting block 321 may be formed in the same process to reduce the number of masks and reduce production costs.

In an example, the first electrode layer 2 may further include a plurality of first electrodes disposed corresponding to the first light emitting area 31, the first electrodes may correspond to a plurality of first light emitting blocks 311 thereon, and the first light emitting blocks 311 corresponding to the same first electrode have the same color.

Figure 3:
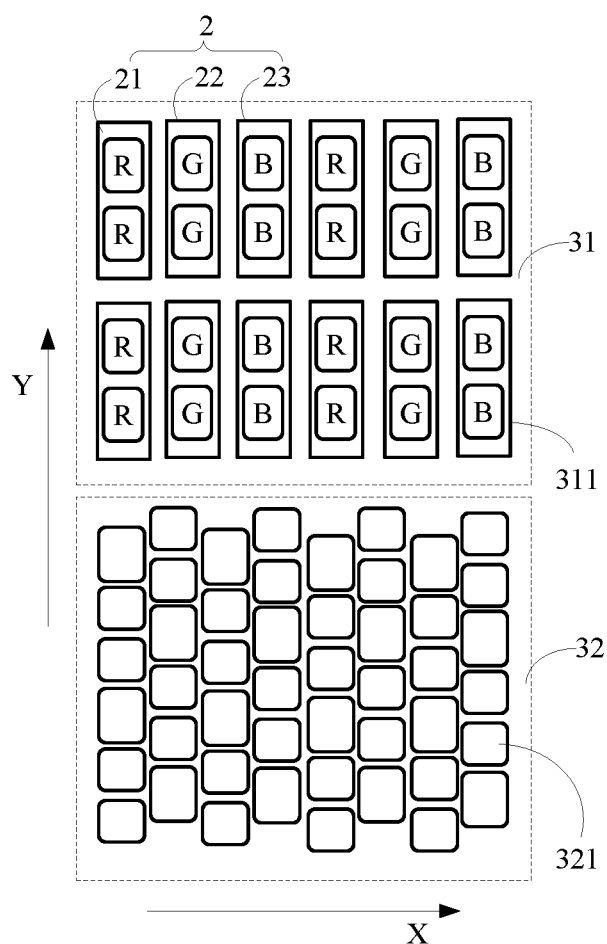
FIG. 3 is a schematic structural diagram illustrating an array substrate according to an example of the present disclosure.

FIGS. 3 to 6 are schematic structural diagrams illustrating array substrates according to different examples of the present disclosure. In an example, as shown in FIG. 3, the first electrode layer 2 may include first electrodes 21, 22, and 23. The first electrode 21, the first electrode 22, and the first electrode 23 respectively correspond to two first light emitting blocks 311 thereon. The first light emitting blocks 311 corresponding to and on the first electrode 21 are both red color blocks, the first light emitting blocks 311 corresponding to and on the first electrode 22 are both green color blocks, and the first light emitting blocks 311 corresponding to and on the first electrode 23 are both blue color blocks. In some examples, each first electrode may further include three or more first light emitting blocks 311 thereon, and the number of the first light emitting blocks 311 included in respective first electrodes may be the same or different, which is not limited in the present disclosure.

The plurality of first light emitting blocks 311 may be vapor-deposited with one mask. Since a plurality of first light emitting blocks 311 may be formed on the same first electrode, a plurality of holes can be formed in an area on one mask corresponding to the first light emitting area 31. Compared with opening a large hole in the mask, the strength of the mask can be improved, the deformation of the mask can be reduced, and the probability of color mixing between adjacent first light emitting blocks 311 can be effectively reduced.

Figure 4:
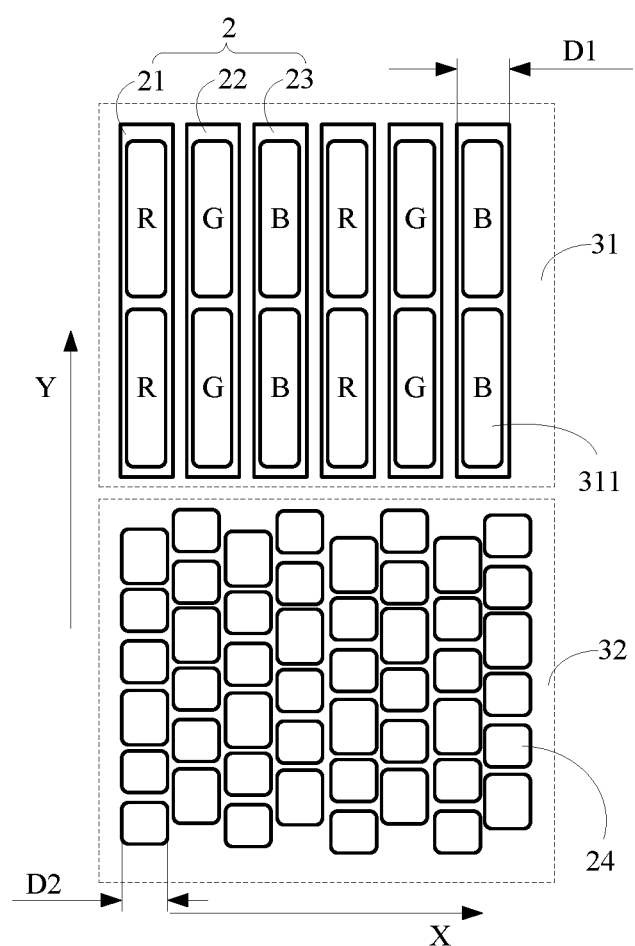
FIG. 4 is a schematic structural diagram illustrating an array substrate according to an example of the present disclosure.

In an example, the first electrodes may be strip electrodes, as shown in FIG. 3; and a plurality of first electrodes may be arranged in a multi-row and multi-column structure. Alternatively, as shown in FIG. 4, a plurality of electrodes may be arranged in one row and multi-column structure. The column direction of the first electrodes is the longitudinal extension direction of the strip electrodes, that is, the direction Y shown in FIGS. 3 and 4; the row direction of the first electrodes is the lateral parallel direction of the strip electrodes, that is, the direction X shown in FIGS. 3 and 4. In some examples, the column direction may be the horizontal side-by-side direction of the strip electrodes, that is, the direction X as shown in FIG. 5, and the row direction is the longitudinal extension direction of the strip electrodes, that is, the direction Y as shown in FIG. 5.

In some examples, the column direction of the first electrodes may be the same as or perpendicular to the row direction of the first light emitting blocks 311. As shown in FIG. 4, the row direction of the first light emitting blocks 311 is the direction X and the column direction of the first electrodes is the direction Y. Then the row direction of the first light emitting blocks 311 is perpendicular to the column direction of the first electrodes. As shown in FIG. 5, the row direction of the first light emitting blocks 311 is the direction X, and the column direction of the first electrodes is also the direction X. Then, the row direction of the first light emitting blocks 311 is parallel to the column direction of the first electrodes.

Figure 5:
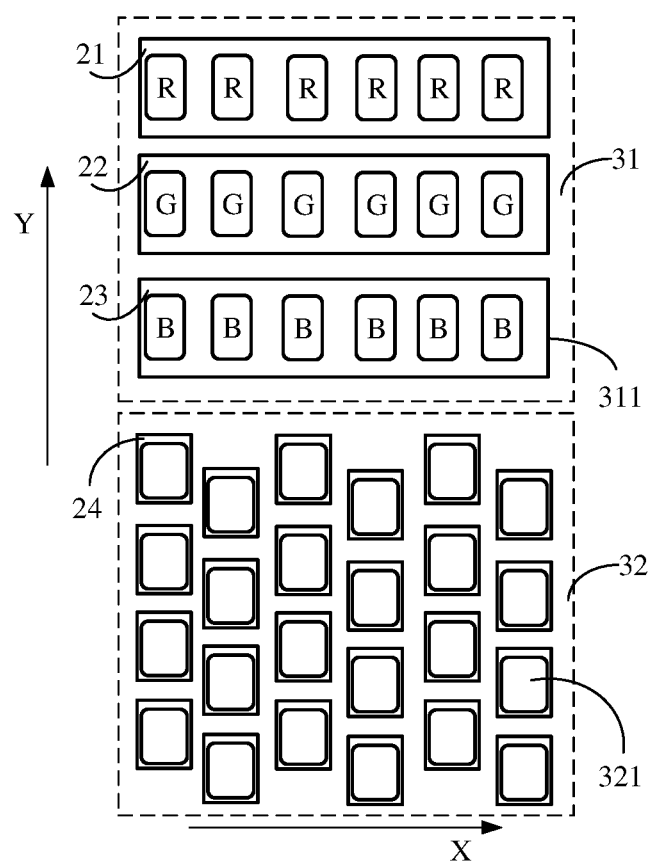
FIG. 5 is a schematic structural diagram illustrating an array substrate according to an example of the present disclosure.
Figure 6:
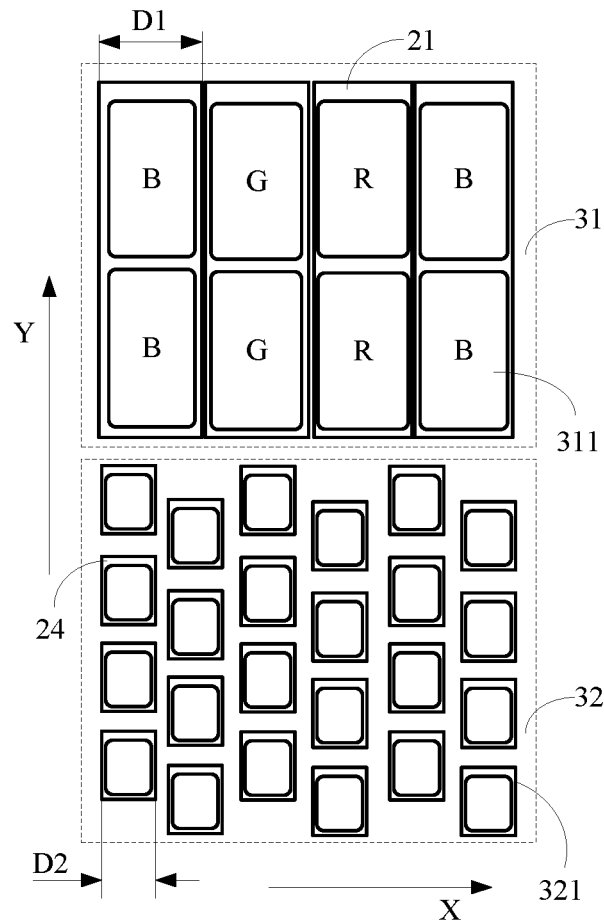
FIG. 6 is a schematic structural diagram illustrating an array substrate according to an example of the present disclosure.

In an example, as shown in FIGS. 4 to 6, the first electrode layer 2 may further include a plurality of second electrodes 24 provided corresponding to the second light emitting area 32, and the second electrodes 24 may correspond to a plurality of second light emitting blocks 321 thereon. In an example, the column direction of the second light emitting blocks 321 may be perpendicular to the column direction of the first electrodes 21. As shown in FIG. 5, the column direction of the second light emitting blocks 321 is the direction Y, and the column direction of the first electrodes 21 is the direction X. In another example, the column direction of the second light emitting blocks 321 may be the same as the column direction of the first electrodes 21, and in this column direction, the width of the first electrode 21 is larger than or equal to the width of the second electrode 24. As shown in FIGS. 4 and 6, the column directions of the first electrodes 21, 22, and 23 are all in the direction Y, and the column direction of the second light emitting blocks 321 is also the direction Y. In the direction Y, the width D1 of the first electrode 21 is larger than or equal to the width D2 of the second electrode 24, that is, $D1 \geq D2$. Here, D1 may be equal to D2, as shown in FIG. 4; or, D1 may be larger than D2, as shown in FIG. 6.

Since the width of the first electrode 21 is larger than the width of the second electrode 24, the area of the first light emitting block 311 is relatively larger, which is beneficial to increase the aperture ratio of the first light emitting block 311, thereby increasing the light emitting intensity, which can effectively compensate for the disadvantage that the first light emitting area 31 is a transparent area and the two-way light transmission causes a decrease in brightness. Of course, the description here is only given with an example in which the direction Y is taken as the column direction of the first electrodes and the second light emitting blocks 321, and in other examples, the entire structure may be rotated by 90°, and the direction X may be the column direction of the first electrodes and the second light emitting blocks 321.

Figure 7:
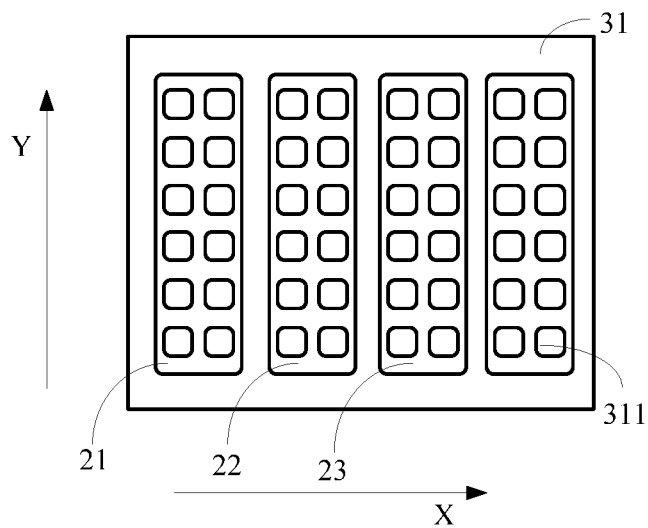
FIG. 7 is a schematic structural diagram illustrating a first light emitting area on an array substrate according to an example of the present disclosure.

FIGS. 7 to 10A are schematic structural diagrams illustrating a first light emitting area on an array substrate according to different examples of the present disclosure. In an example, as shown in FIG. 7, the first electrode may correspond to a plurality of columns of first light emitting blocks 311 along the first direction, and the first direction may be the longitudinal extension direction of the first electrode, that is, the direction Y shown in FIG. 7. Based on this, when the pixel density of the first light emitting area 31 is constant, the number of first electrodes can be effectively reduced while reducing the mask deformation, thereby reducing the processing difficulty.

Figure 8:
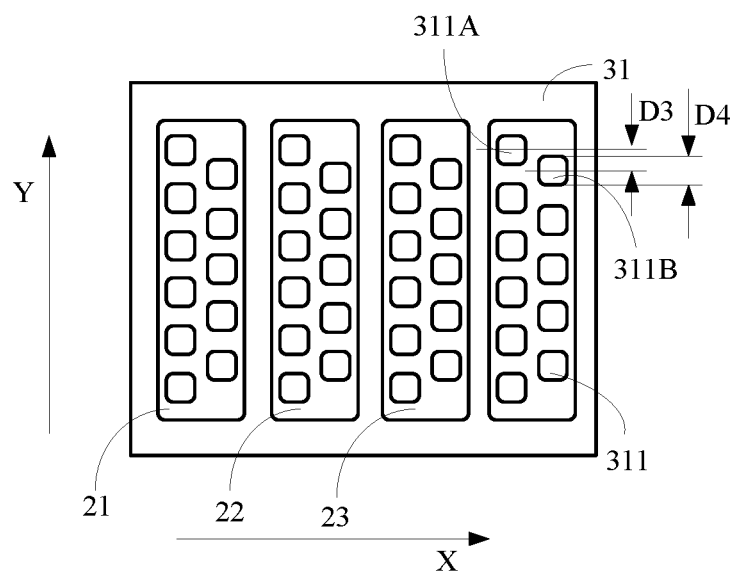
FIG. 8 is a schematic structural diagram illustrating a first light emitting area on an array substrate according to an example of the present disclosure.

In an example, in a second direction perpendicular to the first direction, that is, in the direction X shown in FIG. 7, two adjacent first light emitting blocks 311 on the same first electrode are aligned with each other. Alternatively, as shown in FIG. 8, two first light emitting blocks 311 adjacent to each other in the direction X on the same first electrode are arranged in a misaligned manner. Compared with the aligned arrangement shown in FIG. 7, the misaligned arrangement shown in FIG. 8 can improve the evenness of the arrangement of the first light emitting blocks 311 and effectively improve the display effect.

In an example, as shown in FIG. 8, the corresponding first light emitting blocks 311 on two adjacent first electrodes may be aligned to each other. In an example, as shown in FIG. 9, the corresponding first light emitting blocks 311 on two adjacent first electrodes may also be arranged in a misaligned manner.

In an example, a distance between central axes of two adjacent first light emitting blocks 311 on the same first electrode in the second direction is 0.5-2 times a size of the first light emitting block 311 in the second direction. As shown in FIG. 8, a first light emitting blocks 311A and a first light emitting blocks 311B adjacent to each other in the direction X are arranged in a misaligned manner, and a distance between central axes of the first light emitting block 311A and the first light emitting block 311B in the direction Y is D3. D3 is equal to a length D4 of the first light emitting block 311B in the direction Y. In an example, as shown in FIG. 9, D3=1.5*D4. In an example, D3 may also be 0.5 times, 0.8 times, 1.2 times, or 2 times of D4.

Figure 9:
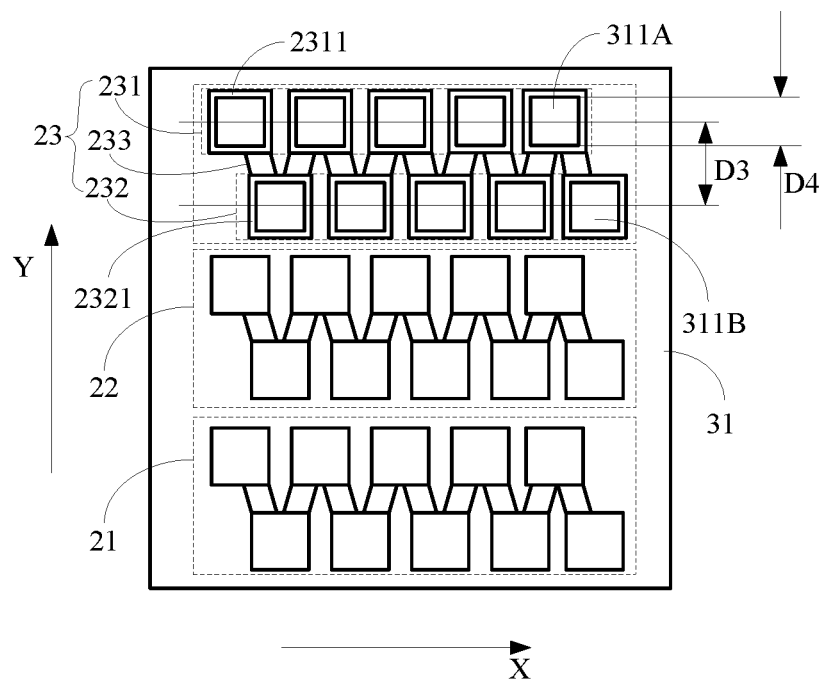
FIG. 9 is a schematic structural diagram illustrating a first light emitting area on an array substrate according to an example of the present disclosure.
Figure 10A:
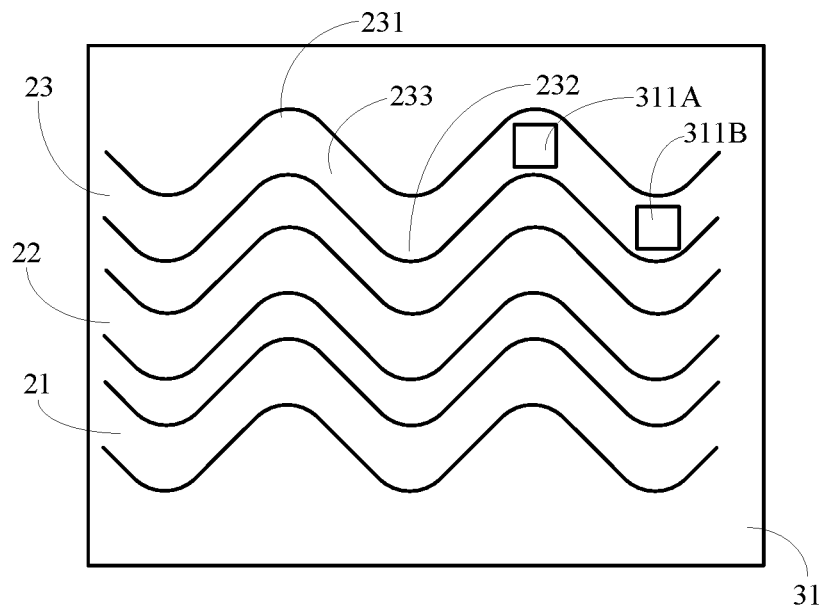
FIG. 10A is a schematic structural diagrams illustrating a first light emitting area on an array substrate according to an example of the present disclosure.

In an example, as shown in FIG. 9 and FIG. 10A, the first electrode 23 may include a plurality of first sub-electrodes 231, and the plurality of first sub-electrodes 231 are arranged in a misaligned manner in the direction Y. Each first sub-electrode 231 may include a plurality of block electrodes or strip electrodes. In an example, as shown in FIG. 9, the first electrode 23 may include a first sub-electrode 231 and a second sub-electrode 232. The first sub-electrode 231 may include a plurality of block electrodes 2311. In an example, there is a one-to-one correspondence between the block electrodes 2311 and the first light emitting blocks; alternatively, a single block electrode 2311 may correspond to a plurality of first light emitting blocks 311. The second sub-electrode 232 may include a plurality of block electrodes 2321.

In an example, as shown in FIGS. 9 and 10A, the first electrode 23 may further include a connecting portion 233 that connects two adjacent sub-electrodes. As shown in FIG. 10A, the two adjacent sub-electrodes 231 and 232 are electrically connected through the connecting portion 233 to obtain a wave-shaped first electrode 23 extending in the direction X. In some examples, the direction X and the direction Y can be adjusted adaptively, such as interchange of directions X and Y or rotating the entire structure by 90°.

Figure 10B:
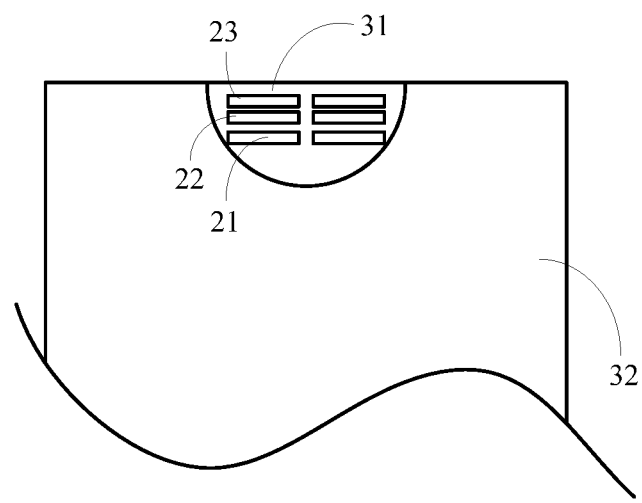
FIG. 10B is a partial schematic structural diagram illustrating an array substrate according to an example of the present disclosure.

FIG. 10B is a partial schematic structural diagram illustrating an array substrate according to an example of the present disclosure. The first electrodes 21, 22, 23 may be arranged in a three-row two-column structure as shown in FIG. 10B in the first light emitting area 31. In some examples, the first electrodes may also be arranged in a two-row and two-column structure, or a three-row and three-column structure in the first light emitting area, and so on. In an example, all the first electrodes in the same row may correspond to the first light emitting blocks 311 of the same color. In some examples, all the first electrodes in the same column may correspond to the first light emitting blocks 311 of the same color.

In an example, the first electrode layer 2 may be an anode, and the second electrode layer 4 may be a cathode. In some examples, the second electrode layer 4 may be a planar electrode, which can effectively simplify the processing difficulty.

Figure 11:
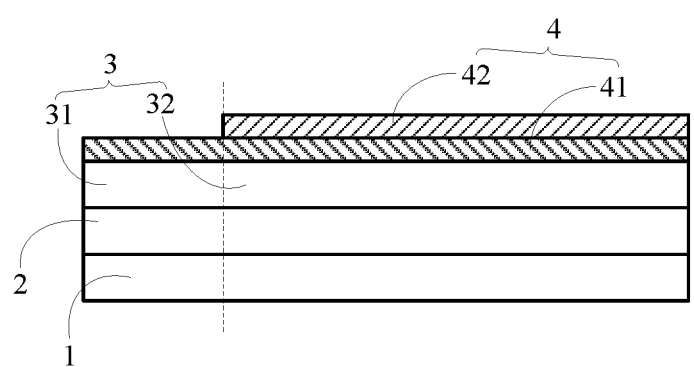
FIG. 11 is a schematic cross sectional view of an array substrate according to an example of the present disclosure.

FIGS. 11 to 13B are schematic cross-sectional views of an array substrate according to an example of the present disclosure. In an example, as shown in FIG. 11, the second electrode layer 4 may include a transparent material layer 41 and a metal layer 42. The transparent material layer 4 may cover the first light emitting area 31 and the second light emitting area 32, and the metal layer 42 may cover the second light emitting area 32. The entire transparent material layer 41 is formed in the same process. Providing the metal layer 42 in the second light emitting area 32 can reduce the resistance of the second electrode layer 4, thereby effectively reducing the voltage drop.

Figure 12:
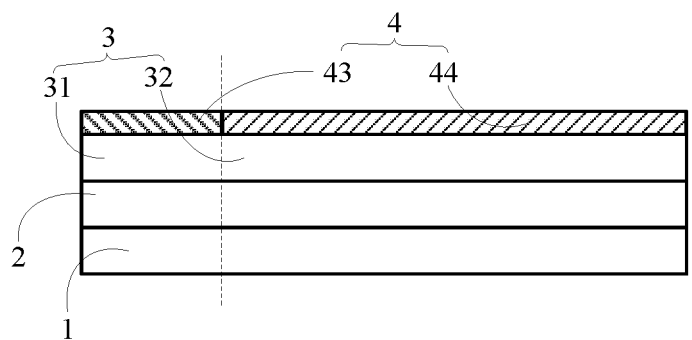
FIG. 12 is a schematic cross sectional view of an array substrate according to an example of the present disclosure.
Figure 13A:
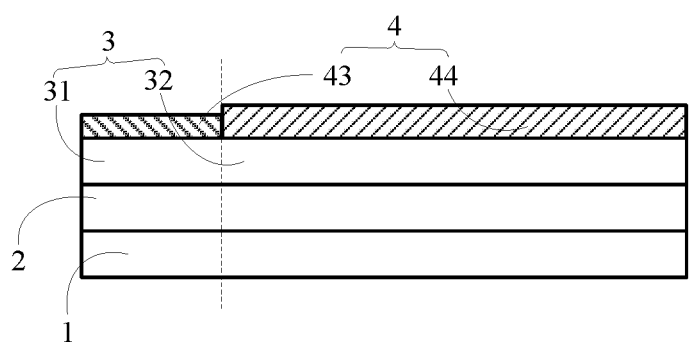
FIG. 13A is a schematic cross sectional view of an array substrate according to an example of the present disclosure.

In an example, as shown in FIG. 12, the second electrode layer 4 may include a third electrode 43 and a fourth electrode 44. The third electrode 43 may be disposed corresponding to the first light emitting area 31, and the fourth electrode 44 may be disposed corresponding to the second light emitting area 32. The third electrode 43 may be a transparent material layer, and the fourth electrode may be a metal layer. In an example, as shown in FIG. 13A, both the third electrode 43 and the fourth electrode 44 may be metal layers, and the thickness of the metal layer of the third electrode 43 corresponding to the first light emitting area 31 is less than that the thickness of the metal layer of the fourth electrode 44 corresponding to the second light emitting area 32.

Figure 13B:
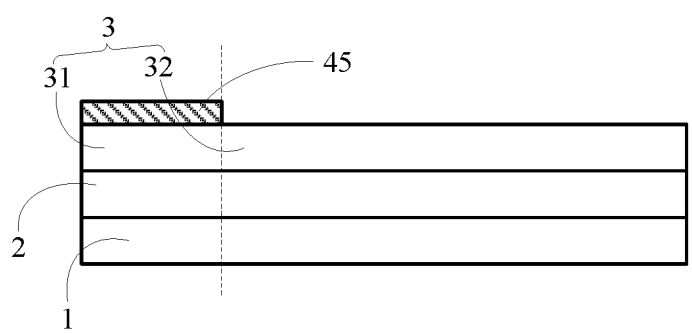
FIG. 13B is a schematic cross sectional view of an array substrate according to an example of the present disclosure.

In the above examples, the transparent material layer may be made of one or more of indium tin oxide (ITO), indium zinc oxide (IZO), silver-doped indium tin oxide, and silver-doped indium zinc oxide; and the metal layer may be made of one or more of Mg, Ag and Al such as pure metal or alloy, such as MgAg alloy. The light transmittance of the first light emitting area 31 can be effectively improved, thereby further improving the photographing effect of the camera located below the first light emitting area 31. In an example, as shown in FIG. 13B, the second electrode layer may further include a fifth electrode 45 provided corresponding to the first light emitting area 31. In an example, the fifth electrode 45 may be a planar electrode.

In an example, the fifth electrode 45 may be a single layer structure or a structure of laminated layers. When the fifth electrode 45 is a single layer structure, the fifth electrode 45 may be a single layer metal layer, a single layer metal mixture layer, or a single layer transparent metal oxide layer; and when the fifth electrode 45 is a structure of laminated layers, the fifth electrode 45 may be laminated layers of a transparent metal oxide layer and a metal layer or laminated layers of a transparent metal oxide layer and a metal mixture layer.

In an example, the material of the fifth electrode 45 is doped with metal, the fifth electrode 45 has a thickness larger than or equal to 100 angstroms and less than or equal to 500 angstroms, and further, the fifth electrode 45 has a thickness larger than or equal to 100 angstroms and less than or equal to 200 angstroms. The thickness of the fifth electrode 45 is continuous as a whole, and the transparency of the fifth electrode 45 is larger than 40%, so that the light transmittance of the first light emitting area 31 can be effectively improved.

In an example, the material of the fifth electrode 45 is doped with metal, and the fifth electrode 45 has a thickness larger than or equal to 50 angstroms and less than or equal to 200 angstroms. The thickness of the fifth electrode 45 is continuous as a whole, and the transparency of the fifth electrode 45 is larger than 50%. Further, the transparency of the fifth electrode 45 is larger than 60%.

In an example, the fifth electrode 45 may be a single layer structure, where the material of the single metal layer may be Al or Ag, the material of the single layer metal mixture layer may be MgAg or an Al-doped metal mixed material, and the transparent metal oxide may be ITO or IZO.

In an example, as shown in FIG. 13A, the third electrode 43 is a metal layer, has a thickness larger than 10 angstroms, forms an integral continuous planar electrode and has a transparency >40%. Further, the metal layer may have a thickness larger than 50 Angstroms, form an integral continuous planar electrode, and have a transparency >50%.

In an example, both of the first electrode layer 2 and the second electrode layer 4 may be made of a transparent material. In an example, the light transmittance of the transparent material may be larger than or equal to 90%. The transparent material may include at least one of indium tin oxide, indium zinc oxide, silver-doped indium tin oxide, and silver-doped indium zinc oxide. In this way, the light transmittance of the first light emitting area 31 can be effectively improved, for example, the light transmittance can be made to be more than 80%.

In an example, the light emitting layer 3 may include an organic light emitting material layer and a common layer. The organic light emitting material layer may include a plurality of independent parts to form a first light emitting block. The common layer may include a hole injection layer, a hole transport layer, an electron transport layer, and an electron injection layer, and at least one of the hole injection layer, the hole transport layer, the electron transport layer, and the electron injection layer covers the first electrode layer 2 and a gap between adjacent first electrodes, so that the first electrode layer 2 can be isolated from the second electrode layer 4 by one or more layers in the common layer to avoid short circuits.

Figure 14:
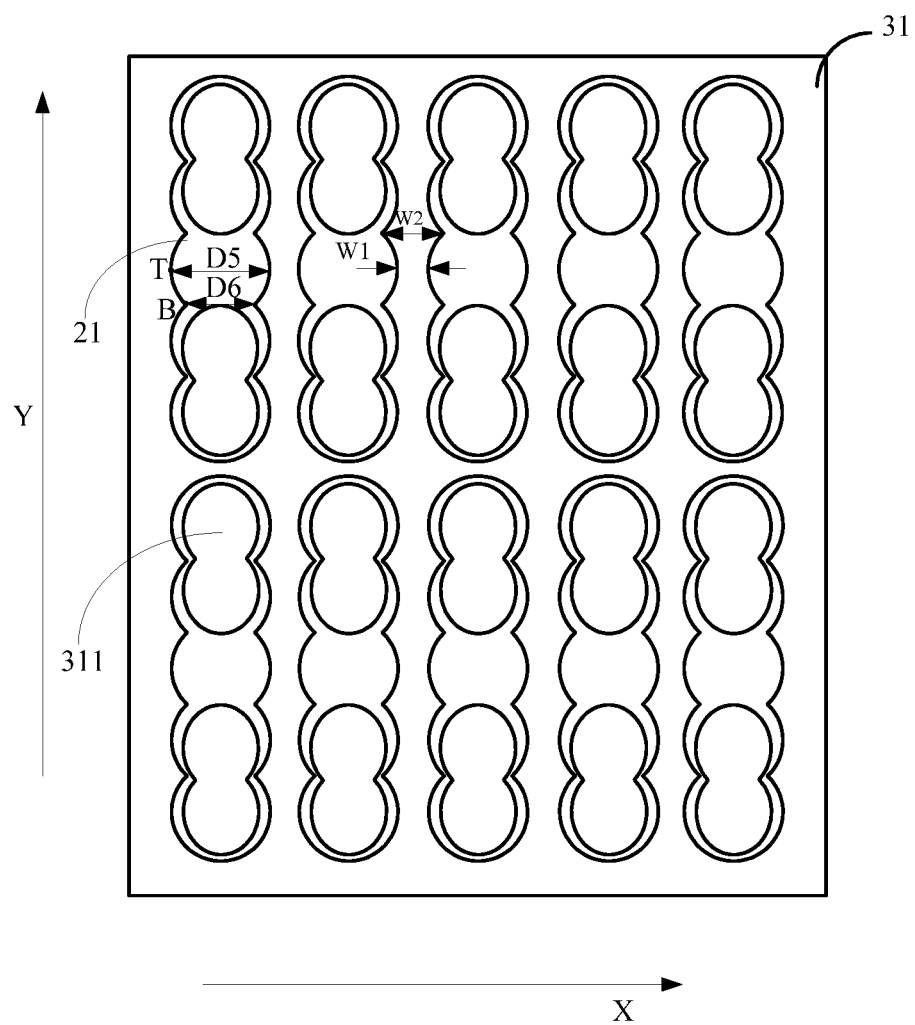
FIG. 14 is a schematic structural diagram illustrating a first light emitting area on an array substrate according to an example of the present disclosure.

FIGS. 14-20 are schematic structural diagrams illustrating a first light emitting area on an array substrate according to different examples of the present disclosure. In an example, as shown in FIG. 14, both edges of the first electrode in the column direction (the direction Y in FIG. 14) may be wave shaped, and the peaks and troughs of the two edges are arranged opposite to each other. In this way, the gap between the first electrodes of two adjacent columns continuously changes or intermittently changes in the column direction. In the column direction, the width of the first electrode 21 may cyclically changes regardless of whether its width changes continuously or intermittently, and the length of one change cycle may correspond to the width of one pixel.

The first light emitting area 31 may be provided with a plurality of rows of wave-shaped first electrodes, so that the width of the first electrode continuously changes or intermittently changes in the column direction, thus the two adjacent columns of first electrodes have a continuously changing distance or an intermittently changing distance. Therefore, between positions with different widths of the first electrodes and different distances of two adjacent columns of first electrodes, the positions of generated diffraction fringes are different, and the diffraction effects at different positions can cancel each other, which can effectively reduce the diffraction effect, and is beneficial to improve the photographing effect of the camera located below the first light emitting area 31.

In an example, as shown in FIG. 14, the first electrodes are arranged in multiple rows and multiple columns, the direction Y is the column direction of the first electrode, and the direction X is the row direction of the first electrode. Each first electrode may include one or more peaks and one or more troughs. Taking the first electrode 21 as an example, the position shown by T in FIG. 14 is a peak, and the position shown by B is a trough. The width D5 between the opposite peaks of the two edges of the first electrode is between 30 μm and (A-X) μm. The width D6 between the opposite troughs of the two edges of the first electrode is larger than X and less than the width D5 between the opposite peaks, where A is the size of the first light emitting block, X is the width value at a part of the electrode having the smallest size, and A is larger than or equal to (30+X) μm. In an example, X may be 4 microns; in an example, X may be less than 4 microns.

Since the edge of the first electrode changes in a wave shape, the distance between adjacent first electrodes also changes accordingly. In an example, as shown in FIG. 14, a minimum distance W1 exists between opposite peaks of two columns of first electrodes, and a maximum distance W2 exists between opposite troughs of two columns of first electrodes. The minimum distance W1 is (A-D5), and the maximum distance W2 is (A-D6).

Figure 15:
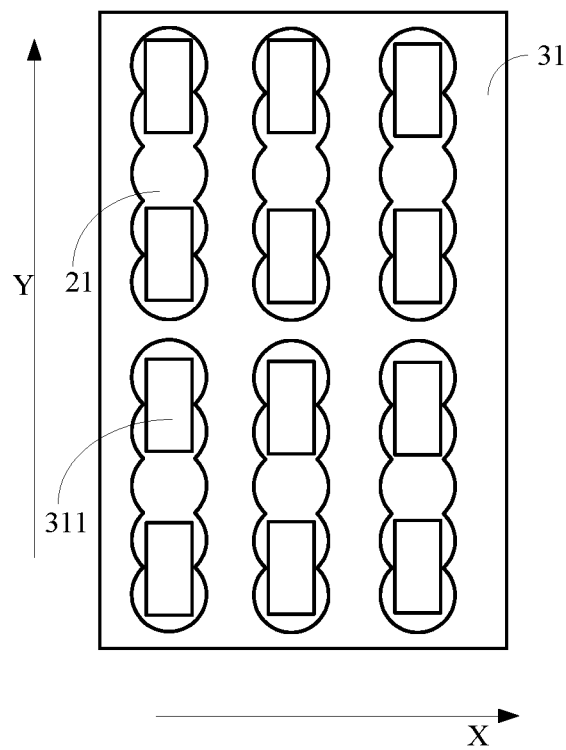
FIG. 15 is a schematic structural diagram illustrating a first light emitting area on an array substrate according to an example of the present disclosure.
Figure 16:
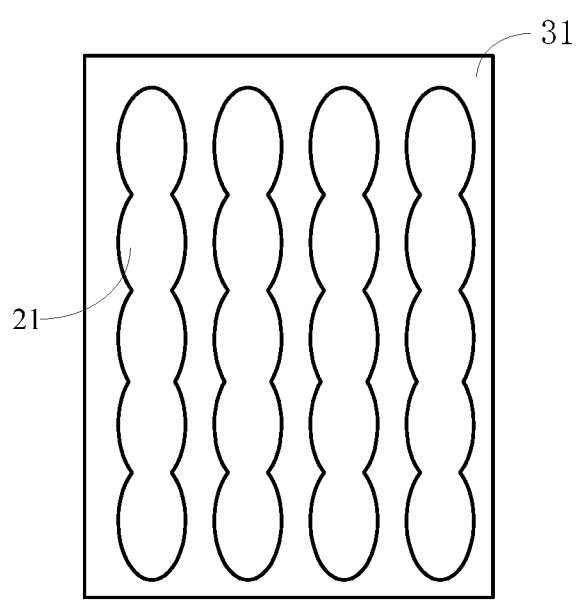
FIG. 16 is a schematic structural diagram illustrating a first light emitting area on an array substrate according to an example of the present disclosure.
Figure 17:
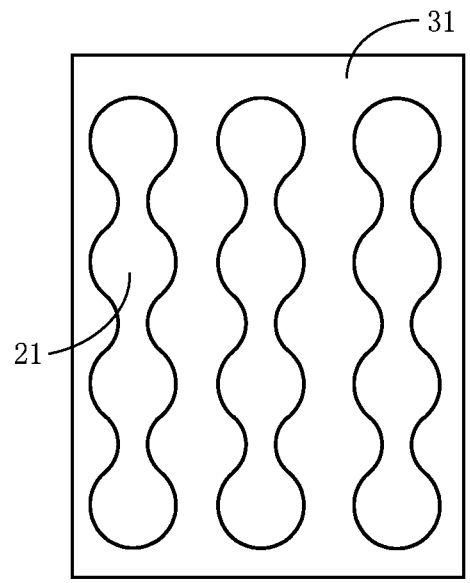
FIG. 17 is a schematic structural diagram illustrating a first light emitting area on an array substrate according to an example of the present disclosure.
Figure 18:
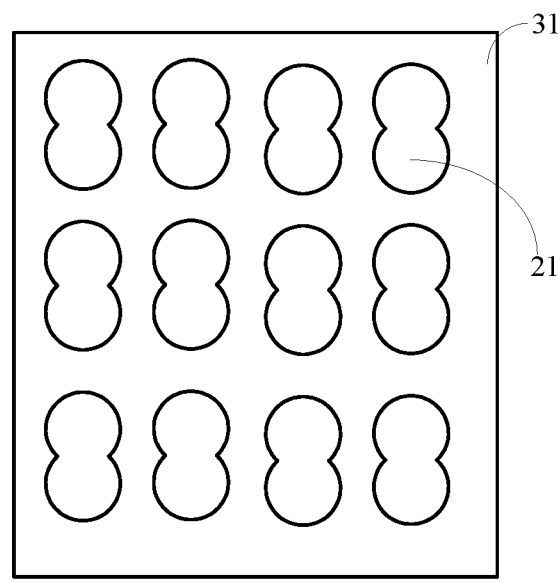
FIG. 18 is a schematic structural diagram illustrating a first light emitting area on an array substrate according to an example of the present disclosure.
Figure 19:
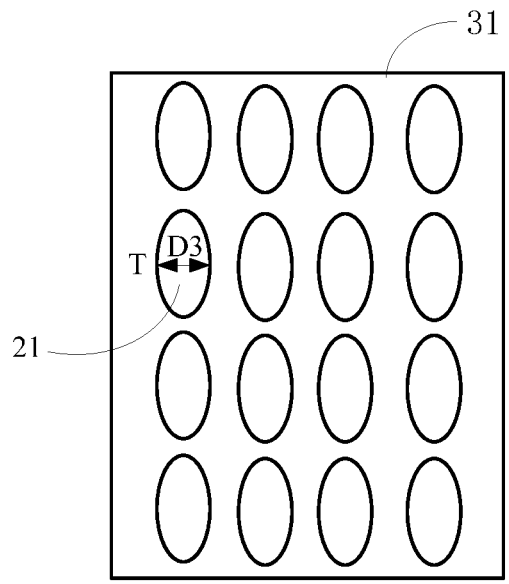
FIG. 19 is a schematic structural diagram illustrating a first light emitting area on an array substrate according to an example of the present disclosure.

In some examples, the shape of the projection of the first electrode 21 on the base substrate may include at least one first graphic unit, so that the above-mentioned peaks and troughs can be formed. The first graphic unit may be circular, oval, dumbbell-shaped, "8"-shaped, or rectangular. As shown in FIGS. 14 and 15, each first electrode 21 may be composed of multiple circles; in an example, as shown in FIG. 16, the first electrode 21 may be composed of multiple ellipses; in an example, as shown in FIG. 17, the first electrode 21 may be composed of a plurality of dumbbells. In some examples, the first electrode 21 may also be composed of multiple "8" shapes, where the "8" shape may be composed of two circular shapes. In an example, the first electrode 21 may also be composed of one first graphic unit. As shown in FIG. 18, each first electrode 21 is composed of one "8"-shaped graphic unit. In an example, as shown in FIG. 19, since each first electrode 21 is composed of an elliptical graphic unit, the first electrode 21 includes only the peak, and there is no trough, correspondingly, two columns of first electrodes have only a minimum distance between them.

Figure 20:
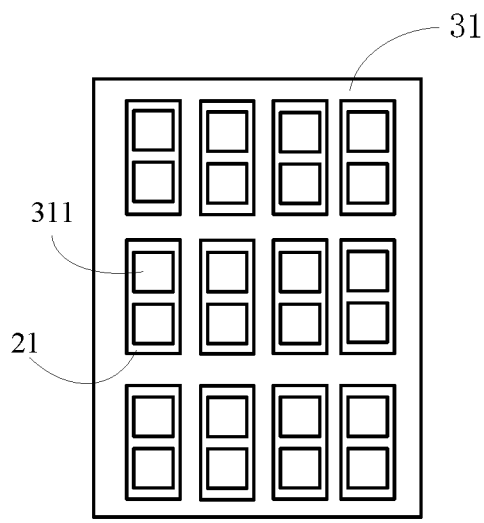
FIG. 20 is a schematic structural diagram illustrating a first light emitting area on an array substrate according to an example of the present disclosure.

In an example, the shape of the projection of the first light emitting block 311 on the base substrate may include at least one second graphic unit, so that the above-mentioned peaks and troughs can be formed. The second graphic unit may include a circle, an ellipse, a dumbbell shape, an "8" shape, or a rectangle. As shown in FIG. 20, the first light emitting blocks 311 may be rectangular.

In an example, the shapes of the first electrodes 21 and the first light emitting blocks 311 may be the same or different. As shown in FIG. 14, the shape of the corresponding first light emitting block 311 on the first electrode 21 is similar to the shape of the first electrode 21, and all are shapes composed of multiple circles. In an example, as shown in FIG. 15, the shape of the corresponding first light emitting block 311 on the first electrode 21 is different from the shape of the first electrode 21. The first electrode 21 is a shape composed of a plurality of circles, and the first light emitting block 311 is rectangular. Alternatively, in an example, the first light emitting block 311 may also be circular or elliptical. In an example, as shown in FIG. 20, the first electrodes 21 and the first light emitting blocks 311 are rectangular. In an example, the corresponding first light emitting block 311 on the rectangular first electrode 21 may also be round or oval.

Figure 21:
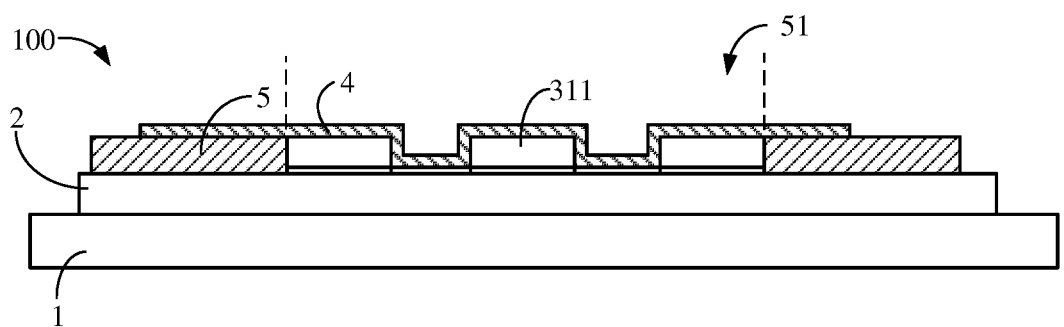
FIG. 21 is a schematic cross sectional view of an array substrate according to an example of the present disclosure.

FIG. 21 is a schematic cross-sectional view of an array substrate according to an example of the present disclosure. In an example, as shown in FIG. 21, the array substrate 100 may further include a pixel defining layer 5. The pixel defining layer 5 is formed on the first electrode layer 2, and includes a plurality of first pixel defining holes 51 provided corresponding to the first light emitting area 31. In an example, each pixel defining hole 51 may be provided with a plurality of first light emitting blocks 311 therein, as shown in FIG. 21. Alternatively, in an example, each pixel defining hole 51 may be provided with one first light emitting block 311 therein, which can effectively reduce the risk of color mixing between adjacent first light emitting blocks 311.

Figure 22:
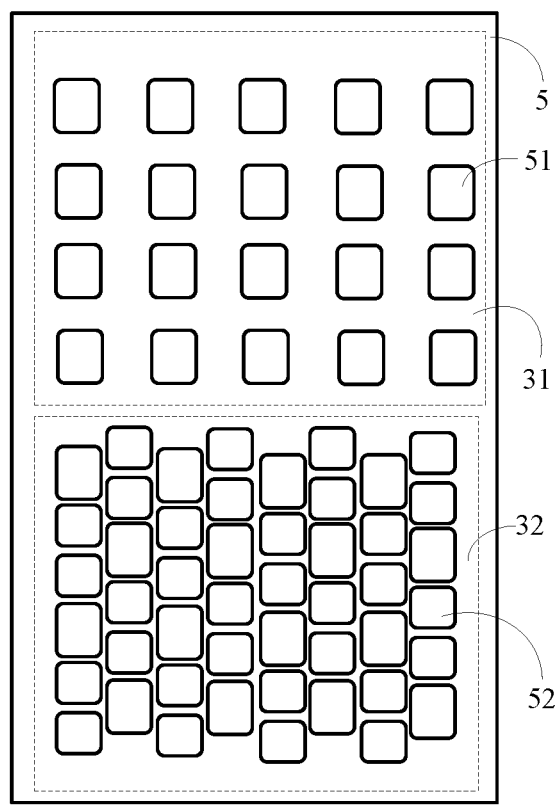
FIG. 22 is a schematic diagram illustrating a structure on an array substrate according to an example of the present disclosure.

FIGS. 22-26 are schematic diagrams illustrating array substrates according to different examples of the present disclosure. As shown in FIG. 22, the pixel defining layer 5 may further include a plurality of second pixel defining holes 52 provided corresponding to the second light emitting area 32. In an example, the second pixel defining holes may correspond to the second light emitting blocks one to one, or a single second pixel defining hole may correspond to a plurality of second light emitting blocks therein.

Figure 23:
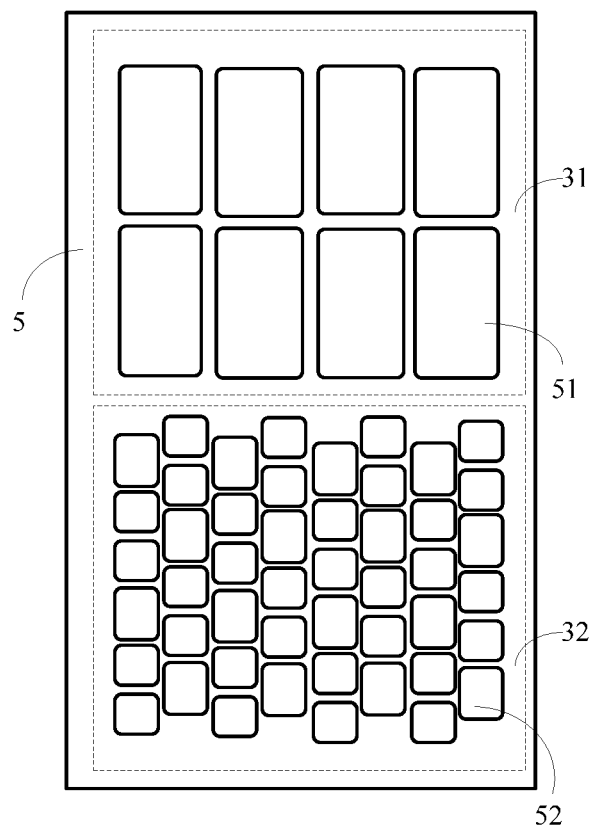
FIG. 23 is a schematic diagram illustrating a structure on an array substrate according to an example of the present disclosure.

In an example, the size of the second pixel defining hole 52 is equal to or smaller than the size of the first pixel defining hole 51. As shown in FIG. 22, the first pixel defining hole 51 and the second pixel defining hole 52 have the same size, which can effectively reduce the difficulty of processing the mask. Alternatively, as shown in FIG. 23, the size of the first pixel defining hole 51 may be larger than that of the second pixel defining hole 52, so that when the distance between adjacent first pixel defining holes 51 is equal to the distance between adjacent second pixel defining holes 52, the distribution density of the first pixel defining holes 51 is relatively smaller, and the number of the gaps between the first pixel defining holes 51 is relatively smaller, which can effectively reduce the probability of light diffraction. In an example, the pixel defining layer 5 may be made entirely of transparent organic material; or, the pixel defining layer 5 may also be made of transparent inorganic material; or, a section of the pixel defining layer 5 corresponding to the first light emitting area 31 may be made of transparent material, and a section corresponding to the second light emitting area 32 may be made of non-transparent material.

Figure 24:
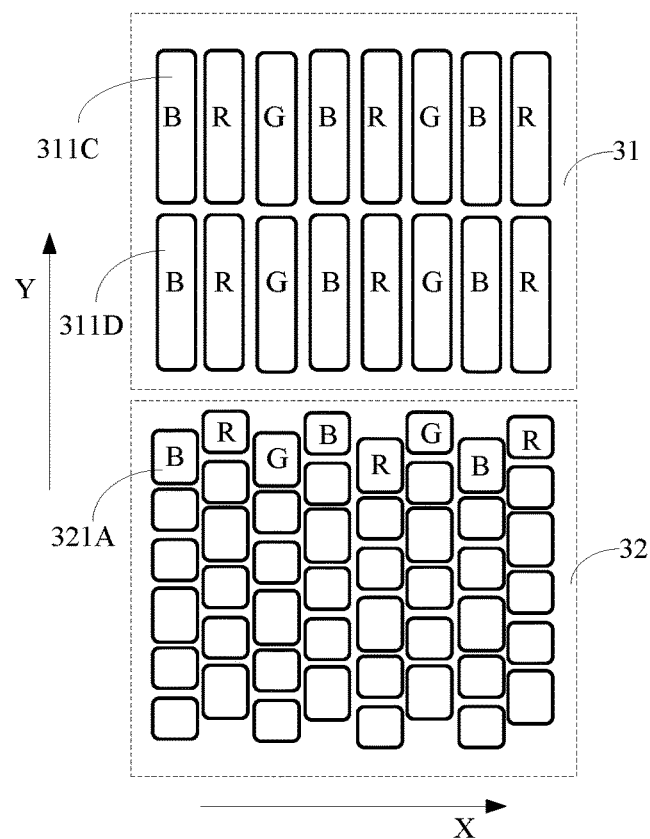
FIG. 24 is a schematic diagram illustrating a structure on an array substrate according to an example of the present disclosure.

In an example, as shown in FIG. 24, a plurality of first light emitting blocks 311 and a plurality of second light emitting blocks 321 are provided in multiple columns, and the columns of the first light emitting blocks 311 and the columns of the second light emitting blocks 321 are in one-to-one correspondence, so that the distribution density of the first light emitting areas 31 can be relatively larger. In an example, as shown in FIG. 24, the column direction of the plurality of first light emitting blocks 311 and the plurality of second light emitting blocks 321 is the direction Y; in some examples, the column direction of the plurality of first light emitting blocks 311 and the plurality of second light emitting blocks 321 is the direction X.

In an example, the color of the first light emitting blocks 311 in the same column is the same as the color of the first second light emitting block 321 in the column and close to the first light emitting area 31, which can reduce the process requirements of the light emitting area 31, and effectively avoid the risk of color mixing of the first light emitting area 31 in the same column direction. As shown in FIG. 24, a first light emitting block 311C and a first light emitting block 311D form a column, and among the second light emitting blocks in the column, the second light emitting block 321A close to the first light emitting area 31 has the same color as the first light emitting block 311C and the first light emitting block 311D. That is, when the second light emitting block 321A is blue, the first light emitting block 311C and the first light emitting block 311D are both blue; or, when the second light emitting block 321A is green, the first light emitting block 311C and the first light emitting block 311D are both green; or, when the second light emitting block 321A is red, the first light emitting block 311C and the first light emitting block 311D are both red.

Figure 25:
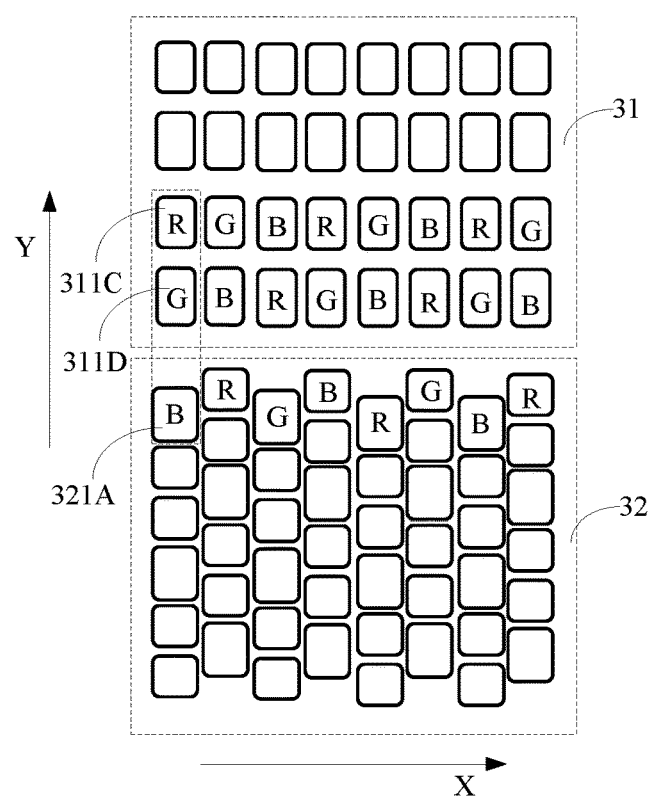
FIG. 25 is a schematic diagram illustrating a structure on an array substrate according to an example of the present disclosure.
Figure 26:
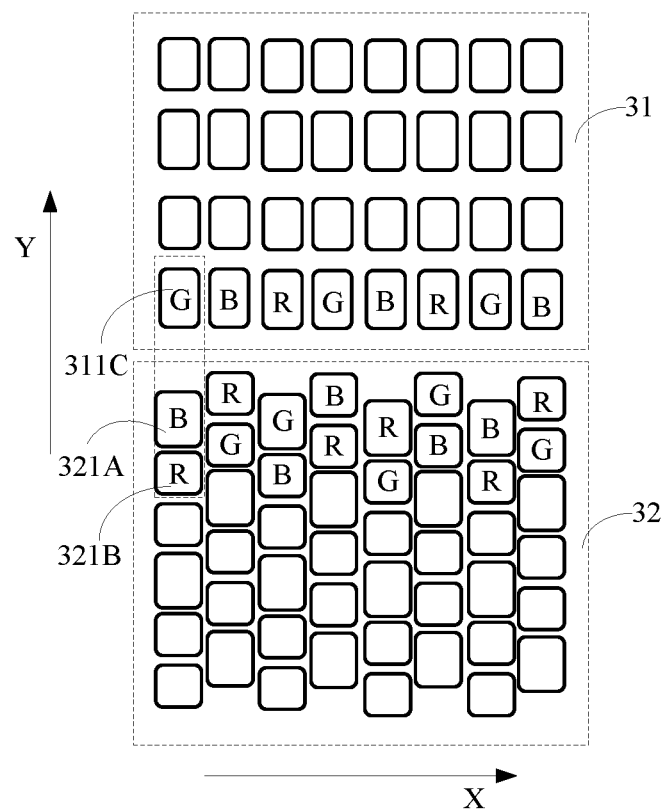
FIG. 26 is a schematic diagram illustrating a structure on an array substrate according to an example of the present disclosure.

In an example, in a column of second light emitting blocks, one or more second light emitting blocks 321 close to the first light emitting area 31 and one or more adjacent first light emitting blocks 311 in the column of first light emitting blocks 311 constitute a pixel repeat unit. In an example, the pixel repeat unit may include three primary colors. As shown in FIG. 25, the second light emitting block 321A, the first light emitting block 311C, and the first light emitting block 311D may constitute a pixel repeat unit including red, green, and blue color blocks (as shown by the dotted frame in FIG. 25). In an example, as shown in FIG. 26, the second light emitting block 321A, the second light emitting block 321B, and the first light emitting block 311C may form a pixel repeat unit including red, green, and blue color blocks (as shown by the dotted frame in FIG. 26). In this way, display transition can be performed at the junction of the first light emitting area 31 and the second light emitting area 32 to improve the display effect. In some examples, the pixel repeat unit may also include two primary colors, such as red and green, red and blue, or green and blue. In some examples, the pixel repeat unit may also include four or more primary colors. Correspondingly, the number of the first light emitting blocks 311 and the second light emitting blocks 321 constituting the pixel repeat unit can be adjusted accordingly.

Figure 27:
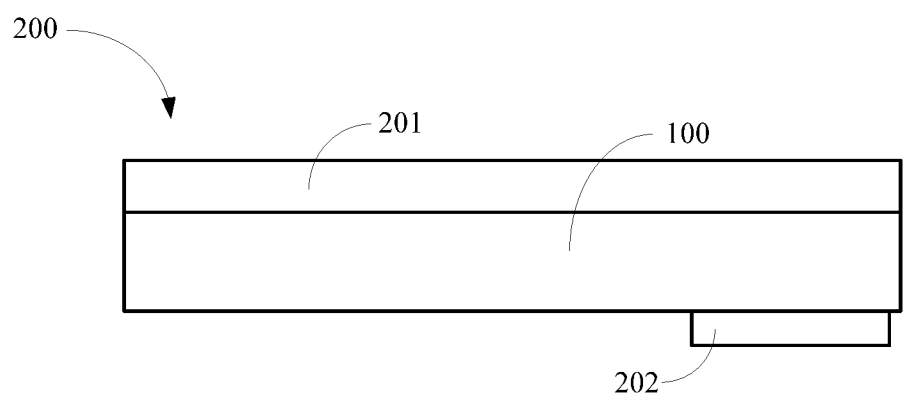
FIG. 27 is a schematic cross sectional view of a display panel according to an example of the present disclosure.

FIG. 27 is a schematic cross-sectional view of a display panel according to an example of the present disclosure. As shown in FIG. 27, the present disclosure further provides a display panel 200. The display panel 200 may include an encapsulation layer 201 and the array substrate 100 described in any of the above examples. The encapsulation layer 201 is located on the side of the array substrate 100 away from the base substrate. A transparent display area provided corresponding to the first light emitting area 31 and a non-transparent display area provided corresponding to the second light emitting area may be formed on the display panel 100. A photosensitive device may be placed under the transparent display area, and the photosensitive device can collect external light through the transparent display area or emit light outward. In an example, when the photosensitive device is in the working state, the transparent display area can be switched to the non-display state, and when the photosensitive device is in a turned off state, the transparent display area can be switched to the display state. In an example, the encapsulation layer 201 may include a polarizer (not shown in the figure), the polarizer may cover the area corresponding to the second light emitting area, and not cover the area corresponding to the first light emitting area to avoid the polarizer affecting the external incident light and/or light emitted by the electronic device.

In an example, the first light emitting area of the array substrate 100 is at least partially surrounded by the second light emitting area. As shown in FIG. 27, the display panel 200 may further include a chip assembly 202, which may be used to control the display state of the first light emitting blocks and the second light emitting blocks, and make the color of the first light emitting blocks and the second light emitting blocks at the junction of the first light emitting area and the second light emitting area consistent, thereby visually weakening the difference between the transparent display area and the non-transparent display area, and effectively improving the visual effect for the user.

Figure 28:
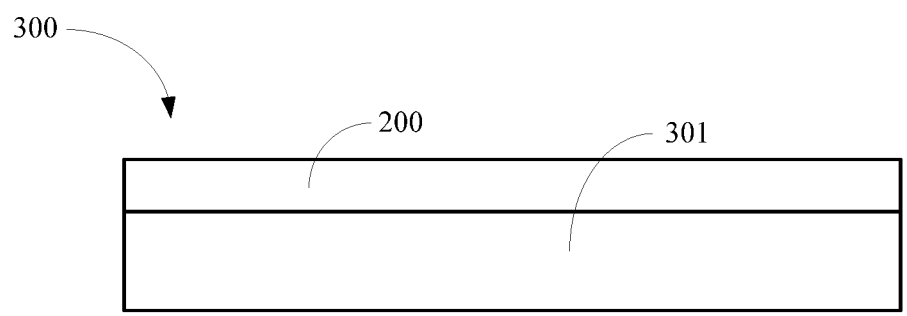
FIG. 28 is a schematic cross sectional view of a display device according to an example of the present disclosure.

FIG. 28 is a schematic cross-sectional view of a display device according to an example of the present disclosure. As shown in FIG. 28, the present disclosure provides a display device 300. The display device 300 may include a device body 301 and the display panel 200 described in any one of the above examples. The display panel 200 is provided on the device body 301 and connected to the device bodies 301. The display panel 200 can use the display panel in any of the above examples to display static or dynamic images.

Figure 29:
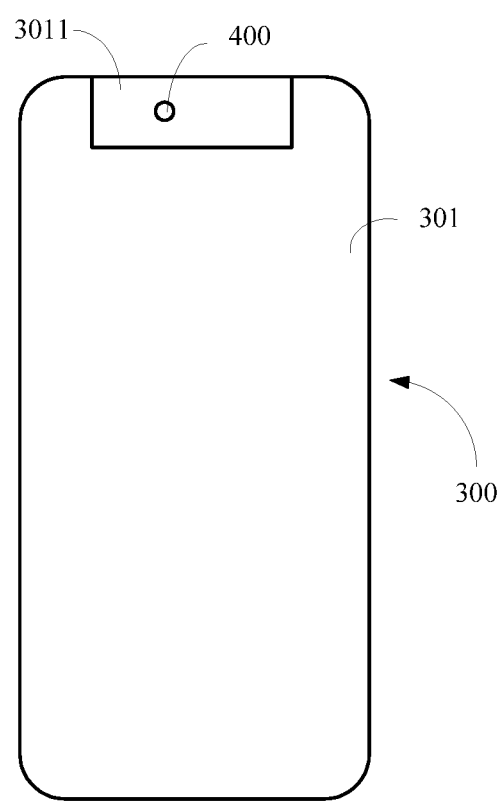
FIG. 29 is a schematic structural diagram illustrating a display device according to an example of the present disclosure.

FIG. 29 is a schematic structural diagram illustrating a display device according to an example of the present disclosure. As shown in FIG. 29, the device body 301 may include a device area 3011, and the device area 3011 may be provided with photosensitive devices such as a camera 400 and a light sensor. The transparent display area of the display panel 200 is disposed corresponding to the device area 3011, so that the photosensitive device can collect external light through the first light emitting area. The display panel in the first light emitting area can effectively mitigate the diffraction effect generated when external light passes through the first light emitting area, thereby effectively improving the quality of the image captured by the camera 400 on the display device and avoiding image distortion due to diffraction. In addition, it can also improve the accuracy and sensitivity of the light sensor to sense external light.

The display device may be any product or component with a display function such as a liquid crystal display device, an electronic paper, a mobile phone, a tablet computer, a television, a display, a notebook computer, a digital photo frame, or a navigator.

Those skilled in the art can understand that the drawings are only schematic diagrams illustrating a preferred example, and the modules or processes in the drawings are not necessarily required to implement the present disclosure. The above is only specific implementations of the present disclosure, but the scope of protection of the present disclosure is not limited to those, and any person skilled in the art can readily think of changes within the technical scope disclosed in the present disclosure, all of them should be covered within the scope of protection of the present disclosure. Therefore, the protection scope of the present disclosure shall be subject to the protection scope of the claims.

The invention claimed is:

1. An array substrate, comprising:
   a substrate;
   a first electrode layer formed on the substrate;
   a light emitting layer formed on the first electrode layer and comprising a first light emitting area and a second light emitting area, the first light emitting area comprising a plurality of first light emitting blocks, the second light emitting area comprising a plurality of second light emitting blocks, the first light emitting blocks and the second light emitting blocks formed by the same process;
   a second electrode layer formed on the light emitting layer,
   wherein the first electrode layer comprises a plurality of first electrodes corresponding to the first light emitting area, each of the first electrodes corresponds to the plurality of the first light emitting blocks, the plurality of the first light emitting blocks on the same first electrode have the same color, and the first light emitting area is a transparent area, and the second light emitting area is a non-transparent area,
   wherein each of the first electrodes corresponds to a plurality of columns of the first light emitting blocks along a first direction, and two adjacent ones of the first light emitting blocks corresponding to the same first electrode along a second direction are aligned or misaligned, wherein the second direction is perpendicular to the first direction.

2. The array substrate according to claim 1, wherein at least part of the first light emitting area is surrounded by the second light emitting area.

3. The array substrate according to claim 1, wherein the first electrodes are strip electrodes, and the first electrodes are arranged in one row and multiple columns, one column and multiple rows, two columns and multiple rows, two rows and multiple columns or multiple rows and multiple columns.

4. The array substrate according to claim 3, wherein a column direction of the first electrodes is parallel or perpendicular to a column direction of the first light emitting blocks.

5. The array substrate according to claim 1, wherein the first electrode layer further comprises a plurality of second electrodes corresponding to the second light emitting area, and each of the second electrodes corresponds to the plurality of the second light emitting blocks thereon.

6. The array substrate according to claim 5, wherein a column direction of the first electrodes is the same as a column direction of the second electrodes, and in the column direction, a width of each of the first electrodes is larger than or equal to a width of each of the second electrodes.

7. The array substrate according to claim 1, wherein a distance between central axes of two adjacent ones of the first light emitting blocks corresponding to the same first electrode in the second direction is 0.5-2 times a size of each of the first light emitting blocks in the second direction.

8. The array substrate according to claim 1, wherein each of the first electrodes comprises:
   a plurality of first sub-electrodes, adjacent ones of the first sub-electrodes in a second direction are arranged in a misaligned manner, each of the first sub-electrodes corresponds to a column of the first light emitting blocks arranged along a first direction, each of the first sub-electrodes comprises a plurality of strip electrodes or block electrodes, and the second direction is perpendicular to the first direction; and
   a connecting portion electrically connecting two adjacent ones of the strip electrodes or block electrodes.

9. The array substrate according to claim 1, wherein the first light emitting blocks corresponding to two adjacent ones of the first electrodes are aligned or misaligned.

10. The array substrate according to claim 1, wherein the first electrode layer is an anode, the second electrode layer is a cathode, the second electrode layer is a planar electrode, the second electrode layer comprises a fifth electrode provided corresponding to the first light emitting area, and the fifth electrode is a planar electrode.

11. The array substrate according to claim 1, wherein both edges of each of the first electrodes in the column direction are wave-shaped, peaks of the two wave-shaped edges are arranged opposite to each other, and troughs of the two wave-shaped edges are arranged opposite to each other; and/or
   both edges of each of the first light emitting blocks in the column direction of the first electrodes are wave-shaped, peaks of the two wave-shaped edges are arranged opposite to each other, and troughs of the two wave-shaped edges are arranged opposite to each other.

12. The array substrate according to claim 1, wherein a shape of a projection of each of the first electrodes on the base substrate comprises at least one first graphic unit;
   a shape of a projection of each of the first light emitting blocks on the base substrate comprises at least one second graphic unit; and
   the first graphics unit and/or the second graphics unit comprise a circle, an ellipse, a dumbbell shape, an "8" shape, or a rectangle.

13. The array substrate according to claim 1, further comprising:
   a pixel defining layer formed on the first electrode layer and comprising a plurality of first pixel defining holes provided corresponding to the first light emitting area, and
   each of the first pixel defining holes corresponds to at least one of the first light emitting blocks.

14. The array substrate according to claim 13, wherein the pixel defining layer further comprises a plurality of second pixel defining holes corresponding to the second light emitting area, and a size of each of the second pixel defining holes is equal to or smaller than a size of each of the first pixel defining holes.

15. The array substrate according to claim 1, wherein the first light emitting blocks and the second light emitting blocks are all arranged in a plurality of columns and in one-to-one correspondence; and a color of the first light emitting blocks in the same column is the same as a color of a first one of the second light emitting blocks in the column and close to the first light emitting area.

16. The array substrate according to claim 1, wherein the first light emitting blocks and the second light emitting blocks are all arranged in a plurality of columns, and at least one of the first light emitting blocks in the same column and at least one of the second light emitting blocks disposed in the same column and close to the first light emitting area constitute a pixel repeat unit.

17. The array substrate according to claim 1, wherein the first electrode layer and/or the second electrode layer are made of a transparent material and a light transmittance of the transparent material is larger than or equal to 90%.

18. A display panel, with an array substrate according to claim 1 comprising:
   an encapsulation layer encapsulating on one side of the array substrate away from the base substrate; wherein the encapsulation layer comprises a polarizer covering the second light emitting area, without covering the first light emitting area; and
   a chip assembly configured to control display states of the first light emitting blocks and the second light emitting blocks.

19. A display device, comprising:
   a device body with a device area; and
   a display panel according to claim 18, wherein the display panel covers the device body;
   wherein the device area is located below the first light emitting area, and the device area comprises a photosensitive device that emits or collects light through the first light emitting area.

20. An array substrate, comprising:
   a substrate;
   a first electrode layer formed on the substrate;
   a light emitting layer formed on the first electrode layer and comprising a first light emitting area and a second light emitting area, the first light emitting area comprising a plurality of first light emitting blocks, the second light emitting area comprising a plurality of second light emitting blocks, the first light emitting blocks and the second light emitting blocks formed by the same process;
   a second electrode layer formed on the light emitting layer,
   wherein the first electrode layer comprises a plurality of first electrodes corresponding to the first light emitting area, each of the first electrodes corresponds to the plurality of the first light emitting blocks, the plurality of the first light emitting blocks on the same first electrode have the same color, and
   the first light emitting area is a transparent area, and the second light emitting area is a non-transparent area,
   wherein the first light emitting blocks and the second light emitting blocks are all arranged in a plurality of columns and in one-to-one correspondence; and a color of the first light emitting blocks in the same column is the same as a color of a first one of the second light emitting blocks in the column and close to the first light emitting area.

* * * * *